United States Patent

Risch et al.

[11] Patent Number: 6,066,876
[45] Date of Patent: May 23, 2000

[54] INTEGRATED CIRCUIT ARRANGEMENT HAVING AT LEAST ONE MOS TRANSISTOR MANUFACTURED BY USE OF A PLANAR TRANSISTOR LAYOUT

[75] Inventors: Lothar Risch, Neubiberg; Wolfgang Roesner; Thomas Aeugle, both of Munich; Wolfgang Krautschneider, Hohenthann, all of Germany

[73] Assignee: Siemens Aktiengesellschaft, Munich, Germany

[21] Appl. No.: 09/065,173

[22] Filed: Apr. 23, 1998

[30] Foreign Application Priority Data

Apr. 28, 1997 [DE] Germany ............. 197 17 902

[51] Int. Cl.[7] ............. H01L 29/76; H01L 29/94; H01L 31/062
[52] U.S. Cl. ............. 257/329; 257/330; 257/302; 257/242; 257/244; 257/742
[58] Field of Search ............. 257/329, 330, 257/302, 242, 244, 742

[56] References Cited

U.S. PATENT DOCUMENTS 5,258,635 11/1993 Nitayama et al.
5,302,843 4/1994 Yamazaki ............. 257/296

FOREIGN PATENT DOCUMENTS 0261666 3/1988 European Pat. Off. ........ H01L 27/08

OTHER PUBLICATIONS

Vertical MOS Transistors With 70nm Channel Length—Risch et al., Proceedings ESSDERC 1995.
Experimental Study Of Carrier Velocity Overshoot in Sub–0.1 μm Devices–Physical Limitation of MOS Structures—Mizuno et al—1996 IEEE IEDM 96–109–112.
Vertical FET Gives NTT Twice The Chip Density—Electronics/Nov. 18, 1985.
IBM Technical Disclosure Bulletin—vol. 32 No. 8A, Jan. 1990—144.

*Primary Examiner*—Mahshid Saadat
*Assistant Examiner*—Matthew Warren
*Attorney, Agent, or Firm*—Hill & Simpson

[57] ABSTRACT

An integrated circuit arrangement contains an MOS transistor surrounded by an insulation structure, the source and drain thereof being arranged laterally and in different depths. A channel thereof proceeds essentially perpendicular to the surface of the circuit arrangement. Since the channel length is determined by etching or by growing a layer, channel lengths as short as less than 50 nm can be realized. For the manufacture, most of the masks of the traditional circuit arrangements in which planar transistors are integrated are employed, this significantly facilitating incorporation into the semiconductor manufacture.

3 Claims, 3 Drawing Sheets

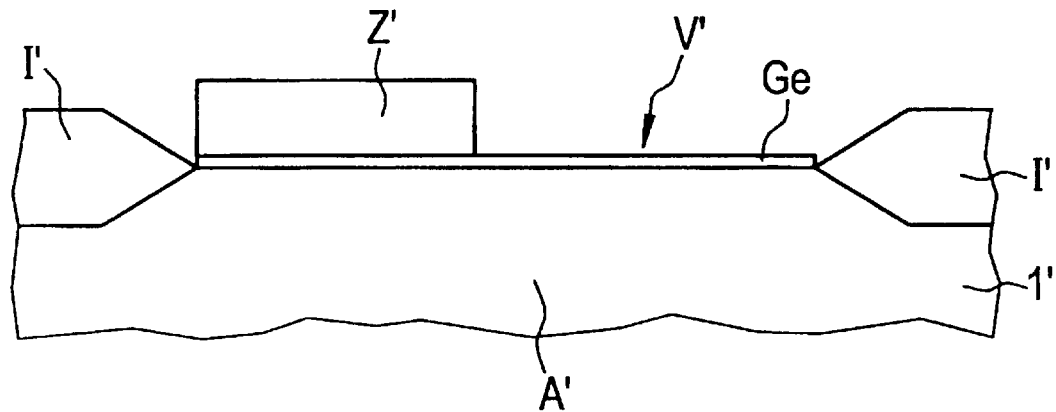
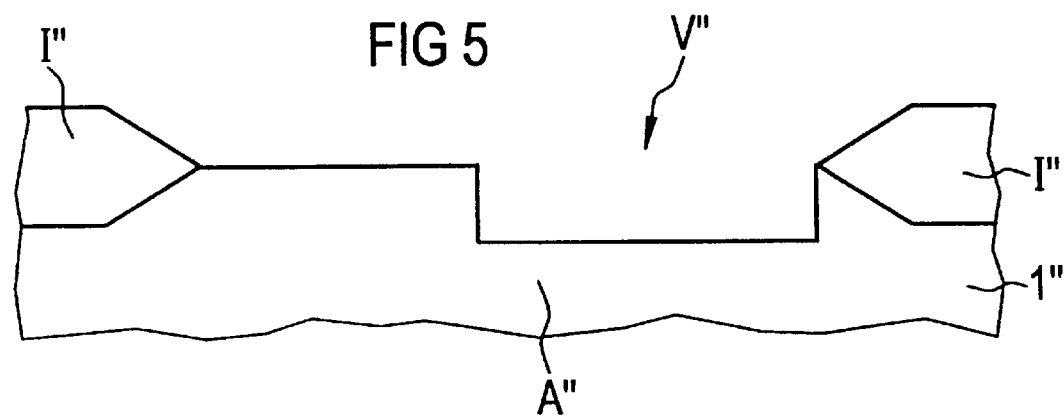

INTEGRATED CIRCUIT ARRANGEMENT HAVING AT LEAST ONE MOS TRANSISTOR MANUFACTURED BY USE OF A PLANAR TRANSISTOR LAYOUT

BACKGROUND OF THE INVENTION

The invention is directed to integrated circuit arrangements having at least one MOS transistor and to methods for the manufacture thereof.

In integrated circuit arrangements, MOS transistors and logic gates are currently usually realized in a planar silicon technology, whereby source, channel region and drain are laterally arranged. The channel lengths that can be achieved are thereby dependent on the resolution of the optical lithography employed and on tolerances in the structuring and alignment. Typical channel lengths of 0.6 µm are achieved in the 16 M generation, 0.35 µm in the 64 M generation.

A further shortening of the channel lengths of MOS transistors is desirable, for example in circuit arrangements in which fast switching events are required, which is usually the case in logic processing. The packing density of a circuit arrangement can also be increased by MOS transistors with short channel lengths. The space-consuming, large channel width that is otherwise necessary can be foregone by employing short channel lengths, specifically when processing high current intensities in, for example, line drivers.

Some possibilities for reducing the channel length have been disclosed. However, the step from the fabrication of a single unit to mass production is time-consuming and costly, specifically in semiconductor technology. New, improved circuit structures are therefore especially attractive for semiconductor manufacture when it is only the existing know-how that has to be recoursed, insofar as possible. This economic aspect is not satisfied by the prior proposals for realizing shortened channel lengths.

For example, it was proposed that shorter channel lengths be achieved in planar MOS transistors by replacing the optical lithography with electron beam lithography, a resolution of which is significantly better (see, for example, T. Mizuno, R. Ohba, IEDM Tech. Dig., p. 109 (1996)). Individual, functional MOS transistors with channel lengths as short as 50 nm have hitherto been successfully produced with an electron beam printer on a laboratory scale. Although known layouts that must merely be miniaturized can be employed with this technology, electron beam lithography is slow; as a result thereof, it seems unsuitable for employment in semiconductor manufacture.

Masks are under-etched, i.e. hollowed out underneath, by isotropic over-etching of layers, as a result of which smaller structural sizes than those belonging to lithography can likewise be produced. However, it is difficult to achieve reproducible results with this technique, for which reason it will presumably also not be employed on a broad basis in semiconductor manufacture.

Further possibilities of obtaining short channel lengths are available given a channel path that is perpendicular to the surface of the circuit arrangement instead of parallel. Transistors having a perpendicular channel course are referred to as "vertical transistors". The channel length is thereby determined by the layer thickness of the channel region and is thus independent of the resolution of the lithography employed.

A circuit arrangement of integrated MOS transistors has been disclosed whose source, channel region and drain are stacked above one another as layers (see German Letters Patent DE 4340967 C1). The contacting of source, drain and gate electrode of such an MOS transistor, accordingly, occurs differently than given planar transistors. At least two of the layers are grown by epitaxy. A depression that has its sidewalls provided with a gate dielectric and a gate electrode is etched into this layer sequence. A channel length as short as less than 50 nm is achieved by this procedure. What is especially disadvantageous is the increased process expense when incorporating this circuit arrangement into semiconductor manufacture due to the manufacturing method that clearly differs from the traditional manufacturing method.

SUMMARY OF THE INVENTION

It is an object of the invention to specify an MOS transistor that is situated within an integrated circuit arrangement, and which has an especially short channel length and can be integrated into the semiconductor manufacture with reduced expense. Furthermore, a manufacturing method is provided for such an MOS transistor incorporated in an integrated circuit arrangement.

This problem is solved by a vertical MOS transistor that is surrounded by a traditional insulation structure. The transistor is designed at one sidewall of a depression. The transistor is individually driveable and can be manufactured by use of a layout of traditional planar transistors, except for one or a few additional masks. Source/drain regions are arranged diagonally offset relative to one another, i.e. laterally and at different depths. The flow of current proceeds essentially perpendicular to the surface of the circuit arrangement.

The layout of the traditional planar transistors is employed for manufacturing a circuit arrangement of the invention, with the difference that a gate mask employed for the generation of a gate electrode is shortened compared to a gate mask for generating the traditional planar transistors in the region of the MOS transistor. One of the additional masks is employed for generating the depression.

The term "channel width" describes the dimension of the channel perpendicular to the flow of current and parallel to the gate electrode.

The term "junction depth" describes the path along which the source/drain regions have minimal spacing from one another, namely perpendicular to the flow of current and perpendicular to the gate electrode.

Since the channel length is determined by etching or by growing a layer, channel lengths as short as less than 50 nm can be realized. The invention makes it possible to process circuit arrangements that were fabricated in planar technology with the assistance of the few additional masks with transistors having a considerably shorter channel length, but the same channel width. Merely due to the contacting of source and drain that clearly differs from planar transistors, new masks and a layout differing completely from the layout of traditional planar transistor are required for the manufacture of previously described vertical MOS transistors. The employment of already existing masks for MOS transistors of the invention considerably reduces the expense required, given integration into semiconductor manufacture.

A further advantage of employing masks that are already present is the easier incorporation of the new circuit structure into circuit arrangements that also comprise known elements.

The designs of known circuit arrangements can be largely accepted, since only a slight modification has to be undertaken at the locations at which improved transistors are needed.

Except for height variations of approximately 150 nm, the surface of the circuit arrangement looks like that of traditional circuit arrangements, this making this invention especially attractive for the layout designer.

The sequence of process steps is essentially the same as in the production of the traditional planar transistors.

The same materials as in the production of the traditional planar transistors can be employed.

Complicated method steps, such as electron beam lithography, and techniques susceptible to malfunction, such as over-etching, are not necessary given the employment of vertical transistors.

A further advantage of the invention is that the simultaneous manufacture of the source/drain regions by implantation—which, by contrast to other vertical transistors, is possible due to the lateral arrangement of these regions—represents a step in the traditional manufacturing process.

The lateral arrangement also offers the advantage that the channel region can be easily connected to a fixed potential, as a result whereof leakage currents and changes in the cutoff voltage are kept small.

Together with the vertical arrangement of source and drain, the lateral arrangement yields a junction depth that is small even compared to planar transistors. Negative effects of short channel lengths, such as, for example, the increased sensitivity to punch-through, are thereby positively influenced.

It lies within the scope of the invention to determine the channel length by epitaxy of semiconductor material such as silicon or germanium. A sidewall along which the channel region forms arises, for example, with the assistance of a mask that allows the epitaxy only at specific locations. After removal of the mask, the sidewall arises in this way.

Another possibility of generating the sidewall is comprised in etching the epitaxially grown semiconductor material at specific locations. It is advantageous therefor to apply a layer before the epitaxy of the semiconductor material that serves as etch stop in the etching process. When the semiconductor material is composed of silicon, then this layer acting as etch stop preferably contains germanium since epitaxial growth of silicon thereby becomes possible on the layer, and the layer is selectively etchable relative to the epitaxially grown semiconductor material. When the gate dielectric is generated by thermal oxidation, the germanium at the floor of a depression that arises in the etching process is removed since it is difficult to oxidize.

It lies within the scope of the invention to determine the channel length on the basis of an etching depth when etching silicon.

It is advantageous to design the gate electrode as spacer. First, its alignment relative to the sidewall of the depression thereby occurs automatically, i.e. without using masks to be adjusted. Second, the expanse of the gate electrode is especially small as a result thereof, this increasing the packing density. A gate mask is employed for generating the spacer-shaped gate electrode, this gate mask being shortened such in the region of the transistor compared to a gate mask for generating the traditional planar transistor such that it covers only one end of a channel region of the MOS transistor.

It is advantageous to etch the gate electrode back as far as possible so that the area provided with the gate dielectric between gate electrode and drain, to which a high capacitance that reduces the switching speed is assigned, becomes especially small.

It is advantageous to form the gate dielectric by thermal oxidation since the quality of the boundary surface to the channel region is thereby improved. The defects that arise in this surface along a mask by etching the depression or by growing semiconductor material are integrated into the oxide, where they have no influence.

It is advantageous to implement the generation of the source/drain regions alter the production of the gate electrode. The gate electrode then serves as mask in the implantation. First, this procedure, which becomes possible due to the small expanse of the gate electrode designed as spacer, is a step in the traditional method for manufacturing the planar transistors. Second, the junction depth becomes especially small as a result thereof.

The invention is explained in greater detail below on the basis of exemplary embodiments that are shown in the drawing figures.

BRIEF DESCRIPTION OF THE DRAWINGS

FIG. 4 shows a second embodiment of a substrate after a doped layer, an insulation structure, a layer serving as etch stop and an additional layer are formed;

FIG. 5 shows a third embodiment of a substrate after a doped layer, an insulation structure and a depression are formed;

DESCRIPTION OF THE PREFERRED EMBODIMENTS

The illustrations in the Figures are not to scale.

In a first exemplary embodiment, a first substrate 1 is a semiconductor wafer of single-crystal silicon in which an n-doped layer A is generated adjoining a surface of the first substrate 1. The dopant concentration of the doped layer A amounts to approximately $10^{18}$ cm$^{-3}$.

Figure 1:
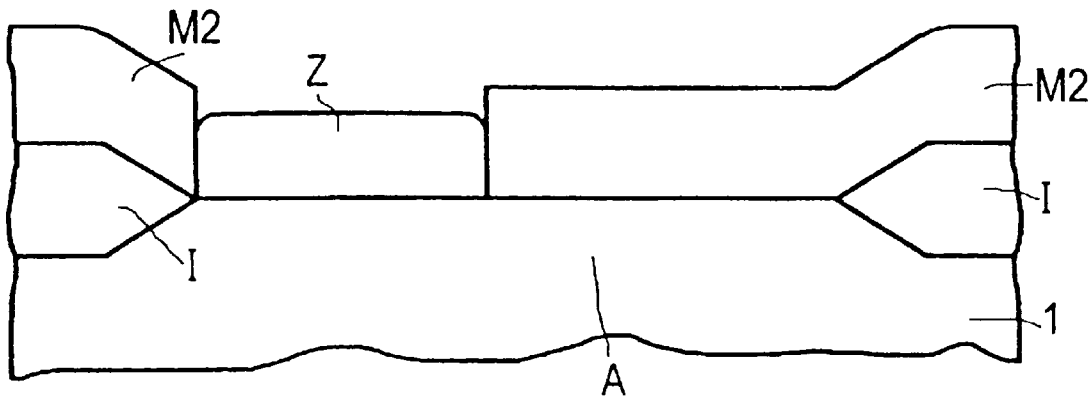
FIG. 1 shows a first embodiment after formation of a doped layer, of an insulating structure, of a mask and of an additional layer.

As in the Prior Art for generating a traditional planar transistor, an insulation structure I that completely surrounds a part of the doped layer A is produced by thermal oxidation (see FIG. 1). An insulation mask M1 is thereby employed that coincides With an insulation mask M1 for the manufacture of the insulation structure surrounding the traditional planar transistor (see FIGS. 6 and 7).

After application of a mask M2 that covers at least one half of the part of the doped layer A that is surrounded by the insulation structure 1, an additional layer Z of silicon whose depth amounts to approximately 150 nm and whose width and length amount to approximately 1 µm is generated by selective epitaxy (see FIG. 1). Serving as mask M2 is an SiO$_2$ layer manufactured with a TEOS method that is deposited surface-wide onto the doped layer A with a thickness of approximately 200 nm and that is subsequently structured with the assistance of a photoresist mask (not shown). After application of the additional layer Z, the mask M2 is in turn removed with, for example, hydrofluoric acid, and a depression V arises as a result thereof.

Figure 2:
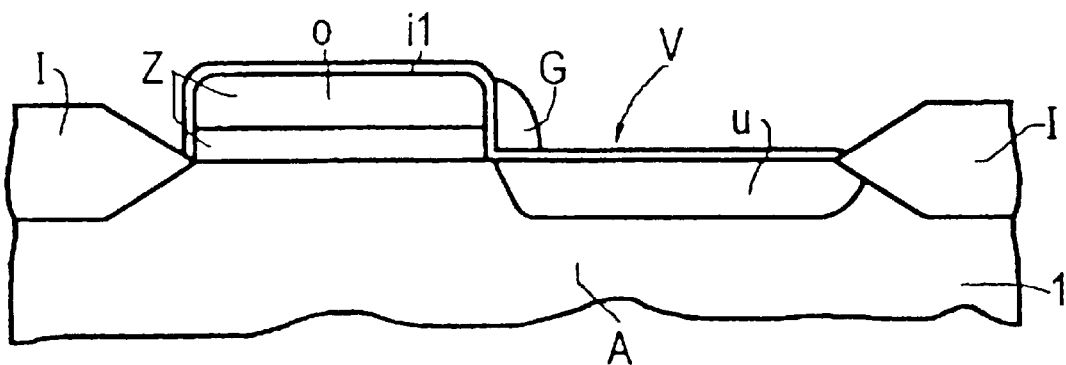
FIG. 2 shows the substrate after the mask was removed and two source/drain regions, a gate dielectric and a gate electrode are formed.

A thermal oxidation is implemented for producing a gate dielectric i1, as a result whereof the additional layer Z and the part of the doped layer A is partially covered by the gate dielectric i1 having a thickness of approximately 5 nm (see FIG. 2).

Subsequently, a gate electrode G is applied to a sidewall of the depression V (see FIG. 2). For producing the gate electrode G, in situ doped polysilicon is deposited in a thickness of approximately 100 nm and is subsequently etched with the assistance of a first gate mask M3 until the gate electrode G arises in the form of a spacer on the part of the doped layer A. A part of the gate electrode G that arises outside the part of the doped layer A serves for the contacting of the gate electrode G and is broader than the remaining part of the gate electrode G (see FIG. 6). The first gate mask M3 essentially coincides with a gate mask M3s that is employed in the Prior Art for generating a gate electrode of the traditional planar transistor, with the difference that the first gate mask M3 is shortened in the region of the part of the doped layer A such that only one end of the sidewall of the depression V is covered (see FIGS. 6 and 7).

Figure 6:
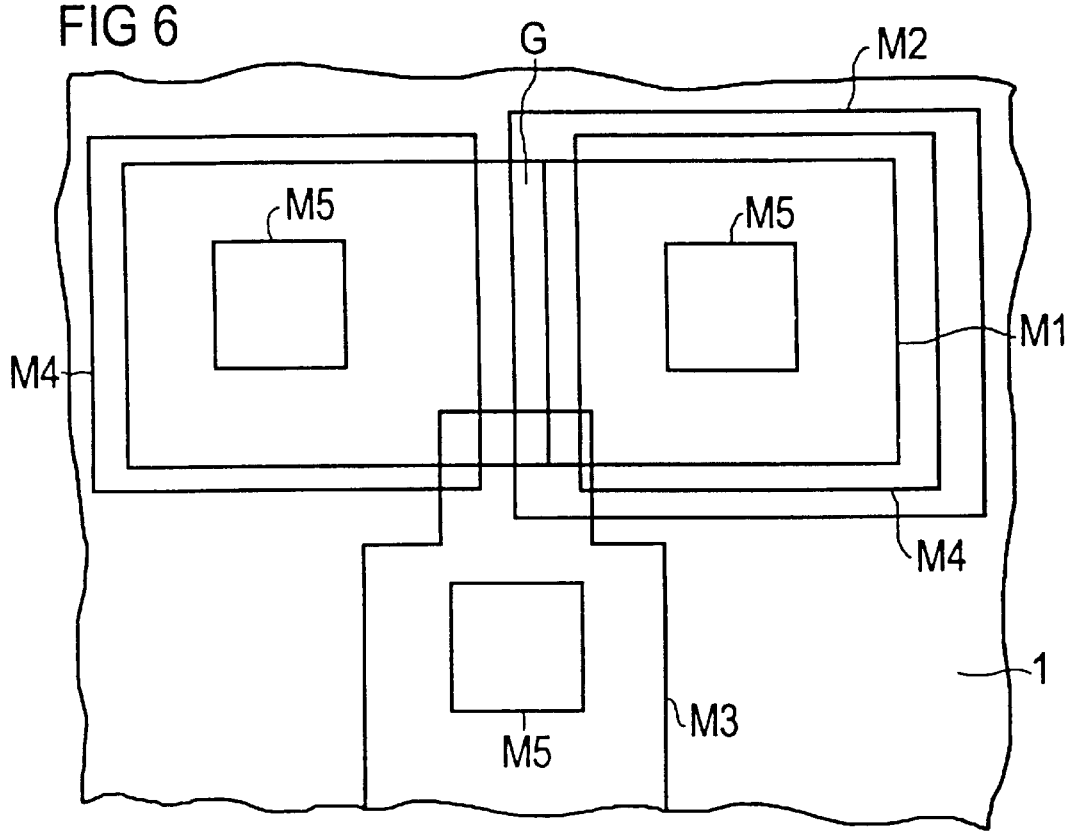
FIG. 6 shows a plan view of the first embodiment in which a few masks employed in the manufacturing method and the gate electrode are shown.

Other spacers that arise in the production of the gate electrode G adjoining the insulation structure I are removed with the assistance of a second gate mask M4 (see FIG. 6). The second gate mask M2 thereby essentially covers the gate electrode G.

An upper source/drain region o and a lower source/drain region u, which are p-doped and approximately 100 nm deep, are generated by implantation and subsequent tempering. As a result thereof, the upper source/drain region o adjoins the sidewall, and the lower source/drain region u adjoins a floor of the depression V (see FIG. 2). The dopant concentrations of the upper source/drain region o and of the lower source/drain region u amount to approximately $10^{21}$ cm$^{-3}$. In the implantation, the gate electrode G acts as mask in the generation of the upper source/drain region o and of the lower source/drain region u, which minimizes the junction depth.

Subsequently, an insulating layer i2 of SiO$_2$ is applied surface-wide (see FIG. 3). Three via holes K are introduced into the insulating layer i2, the first thereof extending up to the upper source/drain region o, the second up to the lower source/drain region u, and the third up to the part of the gate electrode G that serves for contacting (see FIGS. 3 and 6). A via hole mask M5 is thereby employed that coincides with a via hole mask M5s for the production of via holes for the traditional planar transistor (see FIGS. 6 and 7).

Figure 3:
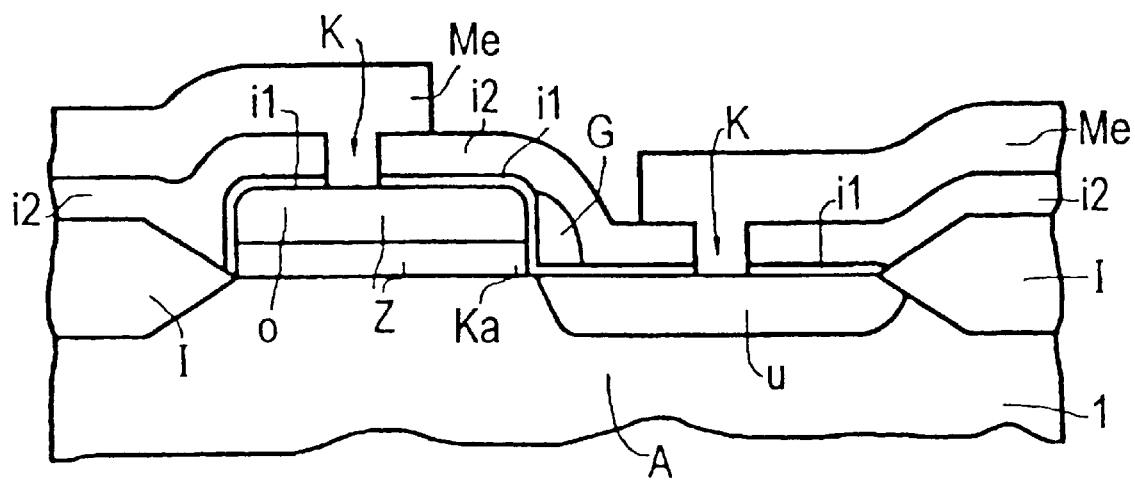
FIG. 3 shows the substrate after an insulating layer and via holes were formed and the via holes were filled with metal by applying a metal layer.

A metal layer Me that, for example, contains aluminum is applied surface-wide and structured (se FIG. 3). Voltages can be applied to the upper source/drain region o and to the lower source/drain region u via the via holes K filled with metal by the metal layer Me. The gate electrode G is also contacted via a part of the structured metal layer Me (see FIG. 6). A part of the additional layer Z that is located between the upper source/drain region o and the lower source/drain region u acts as channel region Ka. Given a corresponding drive of the gate electrode G, a conductive channel forms at the sidewall of the depression V to which the upper source/drain region o is adjacent. It is thus a matter of a vertical transistor that is laterally surrounded by the insulation structure I.

As in the first exemplary embodiment, a second substrate 1' of silicon, a doped layer A' and an insulation structure I' are provided in a second exemplary embodiment (see FIG. 4). A layer Ge of germanium, whose thickness lies in the nm range, is applied on a surface of the doped layer A' and serves as etch stop. Subsequently, approximately 150 nm semiconductor material that contains silicon is grown over the layer Ge of germanium.

With the assistance of a mask (not shown) that is essentially complementary to the mask M2 of the first exemplary embodiment, a depression V' having a width and length of approximately 1 $\mu$m is generated by etching silicon selectively to germanium, the depth of this depression V' being defined by the layer Ge of germanium acting as etch stop. For example, choline is suitable as etchant.

Germanium is removed at a floor of the depression V' by etching germanium selectively to silicon. For example, a mixture of HF, H$_2$O$_2$ and acetic acid is suitable for the etching process.

Analogous to the first exemplary embodiment, a gate dielectric, a gate electrode, an upper and lower source/drain region, an insulating layer and via holes filled with metal are subsequently generated.

In a third exemplary embodiment, as in the first exemplary embodiment, a third substrate 1" of silicon, a doped layer A" and an insulation structure I" are provided.

With the assistance of a mask (not shown) that is essentially complementary to the mask M2 of the first exemplary embodiment, an approximately 150 nm deep depression V" having a width and length of approximately 1 $\mu$m is generated in the doped layer A" by etching silicon selectively to germanium (see FIG. 5).

Subsequently, the mask is in turn removed in an etching step.

Analogous to the first exemplary embodiment, a gate dielectric, a gate electrode, an upper and lower source/drain region, an insulating layer of SiO$_2$ and via holes filled with metal are subsequently generated.

Many variations of the three exemplary embodiments that likewise lie within the scope of the invention are conceivable. In particular, the dimensions of the disclosed layers, regions and depressions can be adapted as desired to the respective requirements. The same is also true of the proposed dopant concentrations. Any conductive material, for example metal, metal silicide or combinations thereof, is an alternative for the gate electrode. Structures and layers of SiO$_2$ can, in particular, be generated by thermal oxidation or by a TEOS process. Alternatively, all structures and layers of SiO$_2$ can be manufactured of some other material, for example silicon nitride.

The doped layer can be p-doped. The source/drain regions can be n-doped.

The gate electrode can also be initially produced of non-doped silicon and be subsequently doped by implantation.

Figure 7:
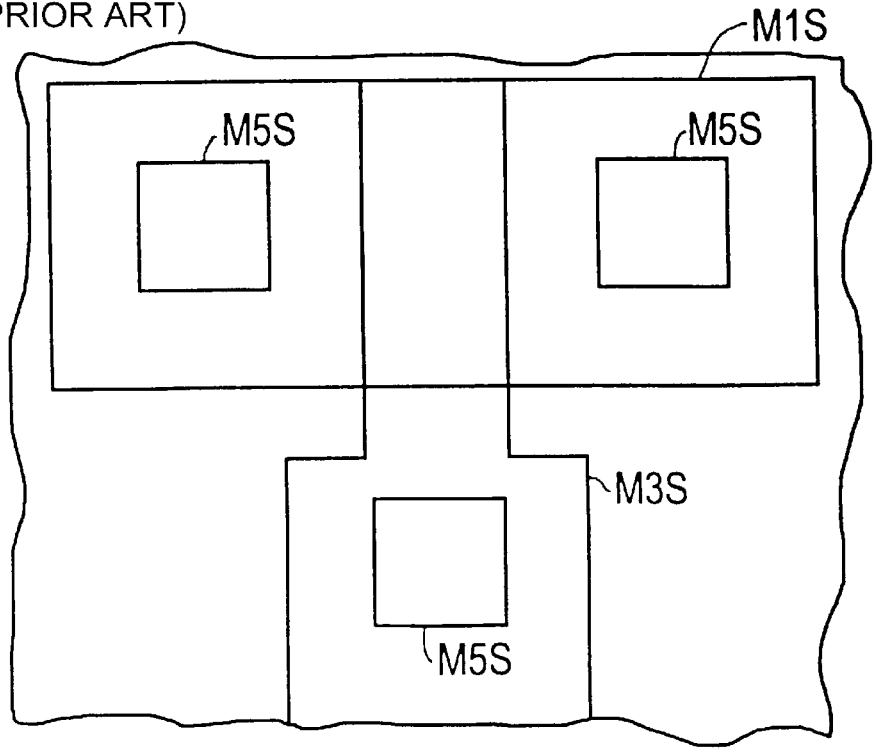
FIG. 7 shows a plan view of a fourth embodiment in which a few masks employed in the manufacturing method of a traditional planar transistor according to the Prior Art are shown.

FIG. 7 shows a fourth substrate 1* in which a traditional planar transistor is produced.

Although various minor changes and modifications might be proposed by those skilled in the art, it will be understood that our wish is to include within the claims of the patent warranted hereon all such changes and modifications as reasonably come within our contribution to the art.

We claim as our invention:

1. An integrated circuit arrangement, comprising:
   at least one MOS transistor;

the MOS transistor being designed as a vertical transistor at a sidewall of a depression and being laterally surrounded by an insulation structure, being individually driveable and, except for one or more additional masks, being manufacturable by use of a planar transistor layout; and upper and lower source/drain regions of the MOS transistor being arranged diagonally offset relative to one another, the upper source/drain region comprising a layer separated from a substrate, the layer being separated from the substrate by a germanium layer.

2. The circuit arrangement according to claim 1, including:

the insulation structure being manufacturable with a mask employed in production of a planar transistor;

the insulation structure surrounding a part of a doped layer that is doped with a first conductivity type;

said upper source/drain region of the MOS transistor and said lower source/drain region of the MOS transistor being arranged in at least one of the part of the doped layer and an additional layer arranged over the part of the doped layer, said source/drain regions being doped with a second conductivity type opposite the first conductivity type, being situated at differing depth and being manufacturable by surface-wide implantation;

the upper source/drain region being adjacent a sidewall of the depression;

a floor of the depression being adjacent to the lower source/drain region;

the lower source/drain region not significantly laterally projecting beyond the depression at the sidewall of the depression; and a gate electrode being arranged at the sidewall of the depression, said gate electrode being electrically insulated from the part of the doped layer, from the upper source/drain region, and from the lower source/drain region by a gate dielectric.

3. The integrated circuit arrangement according to claim 2 wherein a depth of the depression minus a depth of the upper source/drain region is less than 100 nm.

* * * * *